US008949100B1

(12) United States Patent
Cranston et al.

(10) Patent No.: US 8,949,100 B1
(45) Date of Patent: Feb. 3, 2015

(54) SYSTEM, METHOD, AND COMPUTER PROGRAM PRODUCT FOR SIMULATING A MIXED SIGNAL CIRCUIT DESIGN

(75) Inventors: William S. Cranston, Haverhill, MA (US); Junwei Hou, Mountain View, CA (US); Dan R. Kaiser, Traverse City, MI (US); Aaron Mitchell Spratt, Milford, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 285 days.

(21) Appl. No.: 13/093,260

(22) Filed: Apr. 25, 2011

(51) Int. Cl.
*G06F 17/50* (2006.01)
(52) U.S. Cl.
USPC .......................................... 703/14
(58) Field of Classification Search
None
See application file for complete search history.

(56) References Cited

U.S. PATENT DOCUMENTS

| 5,914,682 | A  | * | 6/1999 | Noguchi .................. 341/145 |
| 7,599,821 | B1 |   | 10/2009 | Hou et al. |
| 7,870,518 | B2 |   | 1/2011 | Kaiser |

| 2003/0018459 | A1 | * | 1/2003 | O'Riordan et al. ............. 703/14 |
| 2006/0259879 | A1 | * | 11/2006 | Chetput et al. .................... 716/2 |
| 2007/0124706 | A1 | * | 5/2007 | Kolpekwar et al. ............... 716/1 |

OTHER PUBLICATIONS

Accellera, Verilog-AMS Language Reference Manual, Analog & Mixed-Signal Extensions to Verilog HDL, Version 2.1, Jan. 20, 2003, pp. 1-392.

* cited by examiner

*Primary Examiner* — Omar Fernandez Rivas
*Assistant Examiner* — Bernard E Cothran
(74) *Attorney, Agent, or Firm* — Holland & Knight LLP; Mark H. Whittenberger, Esq.

(57) ABSTRACT

The present disclosure relates to a computer-implemented method for simulating an analog and mixed-signal circuit design having a digital circuit segment connected to an analog circuit segment at a connection point. The method may include inserting a bidirectional interface element at the connection point located between the digital circuit segment and the analog circuit segment. The method may further include splitting the digital circuit segment into a plurality of transistor network models to provide for bidirectional transfer of data between the analog circuit segment and the digital circuit segment.

17 Claims, 12 Drawing Sheets

SYSTEM, METHOD, AND COMPUTER PROGRAM PRODUCT FOR SIMULATING A MIXED SIGNAL CIRCUIT DESIGN

FIELD OF THE INVENTION

The present disclosure relates to design simulation, and more specifically, to simulating a mixed signal circuit design using a plurality of transistor networks.

DISCUSSION OF THE RELATED ART

In order to develop, simulate and test analog and mixed-signal circuit designs, those in the semiconductor and electronic design industry utilize analog-mixed signal extensions (AMS) to such hardware description languages (HDLs) as Verilog and VHDL to describe and define the behavior the behavior of the circuit design, Verilog-AMS for Verilog and VHDL-AMS for VHDL. The language extensions not only provide the ability to model the behavior of analog circuitry and digital circuitry, but also allow integration of existing digital designs with analog designs without the need to rewrite the individual designs. For example, Verilog-AMS handles a cross domain connection within a mixed-signal circuit design (e.g., connections between an analog net segment and a digital net segment) by automatically or manually inserting a connect module at the connection point. By doing so, the analog net and digital net are effectively partitioned, allowing each net to be simulated in its respective domain— the analog net in the continuous domain, and the digital net in the discrete domain. Typically, nets in the continuous domain are simulated using a differential equation kernel that calculates solutions to a set of differential equations at discrete points in time. Nets in the discrete domain, on the other hand, are simulated using a discrete event kernel that calculates discrete signal behavior based on events at discrete points in time. Meanwhile, the connect module, usually comprising an analog port connected to the analog net and a digital port connected to the digital net, is charged with converting signals crossing between the two nets. Specifically, the connect module converts the digital logic value from the digital net to an analog voltage for the analog net, or converts an analog voltage from the analog net to a digital logic value for the digital net.

In some cases, a special connect module called a bi-directional (e.g., BiDir) connect module is utilized to connect an analog net and a digital net together at a bi-directional connection point. For example, a bi-directional connect module would be used to connect an analog net to a digital net comprising a bi-directional devices or models, such as a switch or a transmission gate. As the name suggests, a bi-directional connect module is capable of converting cross domain signals (e.g., analog voltage to digital logic value, digital logic value to analog voltage) regardless of the direction in which they pass (e.g., from the digital net to the analog net or vice versa).

In some cases, it may be necessary to simulate mixed-domain nets which may be connected to Verilog bidirectional primitives (e.g., tran, tranif, etc.) networks. The TRAN network is a model of a circuit containing bi-directional "TRAN" elements that is expressed as a set of Verilog "TRAN" elements and "WIRE" connections. The TRAN network takes input values and processes them to produce outputs, which may be the same as or different from the node values depending on the stability of the network based on the inputs. Outputs that represent new node values replace the old node values, and the TRAN resolution functions can be applied using these "new" node values.

As discussed above, the Verilog-AMS language may provide for the insertion of interface elements on ports. These interface elements may provide the interface between the analog and digital segments of a mixed-domain net. In the case of bidirectional interface elements, which are inserted on inout ports, there may be both drivers and receivers inside this interface element, which write and read the digital segment respectively, in addition to the drivers and receivers outside the interface element. As part of the insertion algorithm, the drivers and receivers on the digital segment of the net may be 'segregated' into those coming from the interface element and those outside the interface element. The final resolved value of the digital segment may be determined solely by the drivers inside the interface element, while the resolved value seen by the interface element may be determined solely by the drivers outside the interface element (the "normal" drivers). Thus, the interface element may dictate when determining the value. It is helpful to consider this segregation as a process of splitting the net into two nets: one driven by the interface element and one driven by the normal drivers.

The algorithm for simulating networks of bidirectional primitives in Verilog may be similar. For example, the drivers of the net may be segregated from the receivers, and fed into the network resolution process. The network resolution then determines a final resolved value of the net in combination with the other inputs to the network.

A problem may arise when a net is connected to both a bidirectional interface element and a bidirectional primitive network. Since both objects (i.e., the interface element and the bidirectional primitive network) desire to determine the final resolved value of the net, a conflict arises. Some exiting approaches that attempt to resolve the two algorithms are provided below. The first approach may allow driver/receiver segregation to occur as normal. This may allow the connect module to win in deciding the net resolution. The second approach may involve turning off driver/receiver segregation. This may allow the tran network to dictate when deciding the net resolution. Both of these approaches have been implemented in existing simulators and found to be lacking over some range of usage.

For example, in the first approach, since this approach essentially treats the tran network as a normal driver, the output of the interface element may not be fed into the tran network. For the analog to digital case, this is incorrect, since the analog part of the circuit has no effect on the tran network or the digital circuit connected to it. Conversely, in the second approach, driver/receiver segregation may be turned off, so both the drivers and receivers in the interface element may be connected directly to the tran network. However, since we now have two bi-directional entities connected together, we have created a feedback loop, out from the interface element driver, into and back out from the tran network, and into the interface element receiver. Since the digital value being fed back into the interface element affects the analog segment of the net, which in turn affects the digital driver inside the interface element, there is the possibility of creating a latch. As a result, any value driven from the analog segment of the net may latch up on the digital input even if the value driven from analog changes. This may even result in oscillation on the digital segment of the net, depending on the topography of the analog circuit connected to the net in question.

SUMMARY OF INVENTION

In one or more embodiments of the present disclosure, a computer-implemented method for simulating an analog and mixed-signal circuit design having a digital circuit segment connected to an analog circuit segment at a connection point is provided. In some embodiments, the method may include inserting a bidirectional interface element at the connection point located between the digital circuit segment and the analog circuit segment. The method may further include splitting the digital circuit segment into a plurality of transistor network models to provide for bi-directional transfer of data between the analog circuit segment and the digital circuit segment.

One or more of the following features may be included. In some embodiments, at least one of the plurality of transistor network models is a shadow transistor network model, the shadow transistor network model being connected to one or more drivers separate from the bidirectional interface element. The method may further include detecting a change in drive strength of at least one of the shadow transistor network model and the analog circuit segment. The method may also include comparing a digital drive strength from the shadow transistor network model with an analog drive strength from the analog circuit segment. The method may additionally include, if the digital drive strength is greater than the analog drive strength, driving a value from the digital circuit segment into the analog circuit segment and driving a high-impedance value (Hi-Z) out from the bidirectional interface element into the transistor network model. The method may also include if the analog drive strength is greater than the digital drive strength, driving a high-impedance value (Hi-Z) into the analog circuit segment and driving a converted value from the analog circuit segment into the transistor network model. The method may further include if the analog drive strength is the same as the digital drive strength, comparing a first driven value from the analog circuit segment with a second driven value from the transistor network model.

In one or more embodiments of the present disclosure, a system for simulating an analog and mixed-signal circuit design having a digital circuit segment connected to an analog circuit segment at a connection point is provided. In some embodiments, the system may include a computing device having at least one processor configured to insert a bidirectional interface element at the connection point located between the digital circuit segment and the analog circuit segment. The processor may be further configured to split the digital circuit segment into a plurality of transistor network models to provide for bi-directional transfer of data between the analog circuit segment and the digital circuit segment.

One or more of the following features may be included. In some embodiments, at least one of the plurality of transistor network models is a shadow transistor network model, the shadow transistor network model being connected to one or more drivers separate from the bidirectional interface element. The processor may be further configured to detect a change in drive strength of at least one of the shadow transistor network model and the analog circuit segment. The processor may be further configured to compare a digital drive strength from the shadow transistor network model with an analog drive strength from the analog circuit segment. In some embodiments, if the digital drive strength is greater than the analog drive strength, the processor is further configured to drive a value from the digital circuit segment into the analog circuit segment and driving a high-impedance value (Hi-Z) out from the bidirectional interface element into the transistor network model. In some embodiments, if the analog drive strength is greater than the digital drive strength, the processor is further configured to drive a high-impedance value (Hi-Z) into the analog circuit segment and driving a converted value from the analog circuit segment into the transistor network model. In some embodiments, if the analog drive strength is the same as the digital drive strength, the processor is further configured to compare a first driven value from the analog circuit segment with a second driven value from the transistor network model.

In one or more embodiments of the present disclosure a computer-readable storage medium for simulating an analog and mixed-signal circuit design having a digital circuit segment connected to an analog circuit segment at a connection point is provided. The computer-readable storage medium may have stored thereon instructions that when executed by a machine result in one or more operations. Operations may include inserting a bidirectional interface element at the connection point located between the digital circuit segment and the analog circuit segment and splitting the digital circuit segment into a plurality of transistor network models to provide for bi-directional transfer of data between the analog circuit segment and the digital circuit segment.

One or more of the following features may be included. In some embodiments, at least one of the plurality of transistor network models is a shadow transistor network model, the shadow transistor network model being connected to one or more drivers separate from the bidirectional interface element. Operations may further include detecting a change in drive strength of at least one of the shadow transistor network model and the analog circuit segment. Operations may also include comparing a digital drive strength from the shadow transistor network model with an analog drive strength from the analog circuit segment. Operations may additionally include, if the digital drive strength is greater than the analog drive strength, driving a value from the digital circuit segment into the analog circuit segment and driving a high-impedance value (Hi-Z) out from the bidirectional interface element into the transistor network model. Operations may also include if the analog drive strength is greater than the digital drive strength, driving a high-impedance value (Hi-Z) into the analog circuit segment and driving a converted value from the analog circuit segment into the transistor network model. Operations may further include if the analog drive strength is the same as the digital drive strength, comparing a first driven value from the analog circuit segment with a second driven value from the transistor network model.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
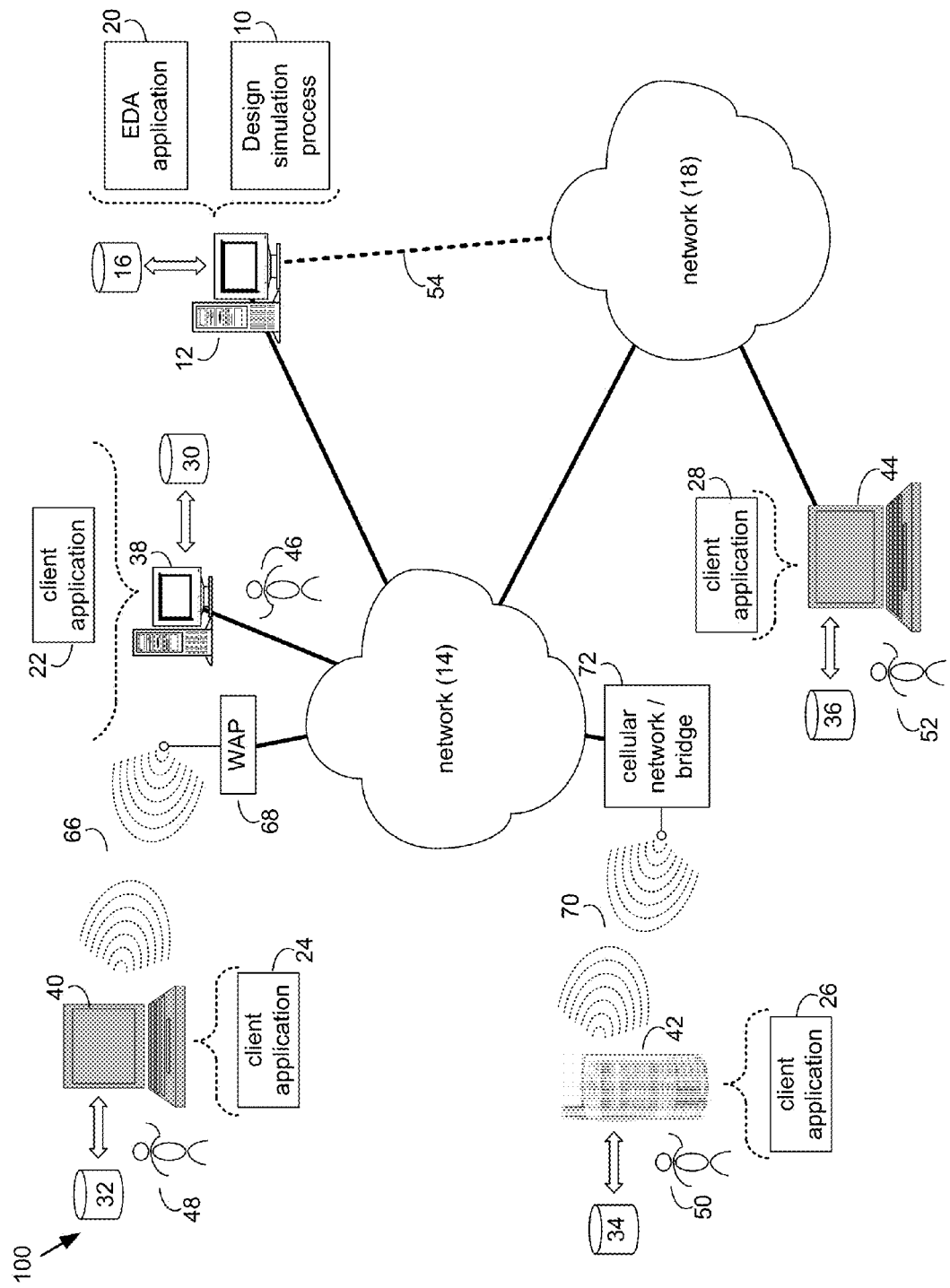
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosures. Some hardware description languages may include, but are not limited to, Verilog, VHDL, and Verilog-AMS. Various other hardware description languages may also be used as well.

Referring to FIG. 1, there is shown design simulation process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the design optimization process may reside on and be executed, in whole or in part, by a client electronic device, such as a personal computer, notebook computer, personal digital assistant, or the like.

As will be discussed below in greater detail, design simulation process 10 may be utilized to simulate an analog and mixed-signal circuit design having a digital circuit segment connected to an analog circuit segment at a connection point. Design simulation process 10 may insert a bidirectional interface element at the connection point located between the digital circuit segment and the analog circuit segment. Design simulation process 10 may further split the digital circuit segment into a plurality of transistor network models to provide for bi-directional transfer of data between the analog circuit segment and the digital circuit segment.

The instruction sets and subroutines of design simulation process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Design simulation process 10 may be a stand alone application, or may be an applet/application/script that may interact with and/or be executed within EDA application 20. In addition/as an alternative to being a server-side process, the design simulation process may be a client-side process (not shown) that may reside on a client electronic device (described below) and may interact with an EDA client application (e.g., one or more of EDA client applications 22, 24, 26, 28). Further, the design simulation process may be a hybrid server-side/client-side process that may interact with EDA application 20 and an EDA client application (e.g., one or more of client applications 22, 24, 26, 28). As such, the design simulation process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize design simulation process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.)

Figure 2:
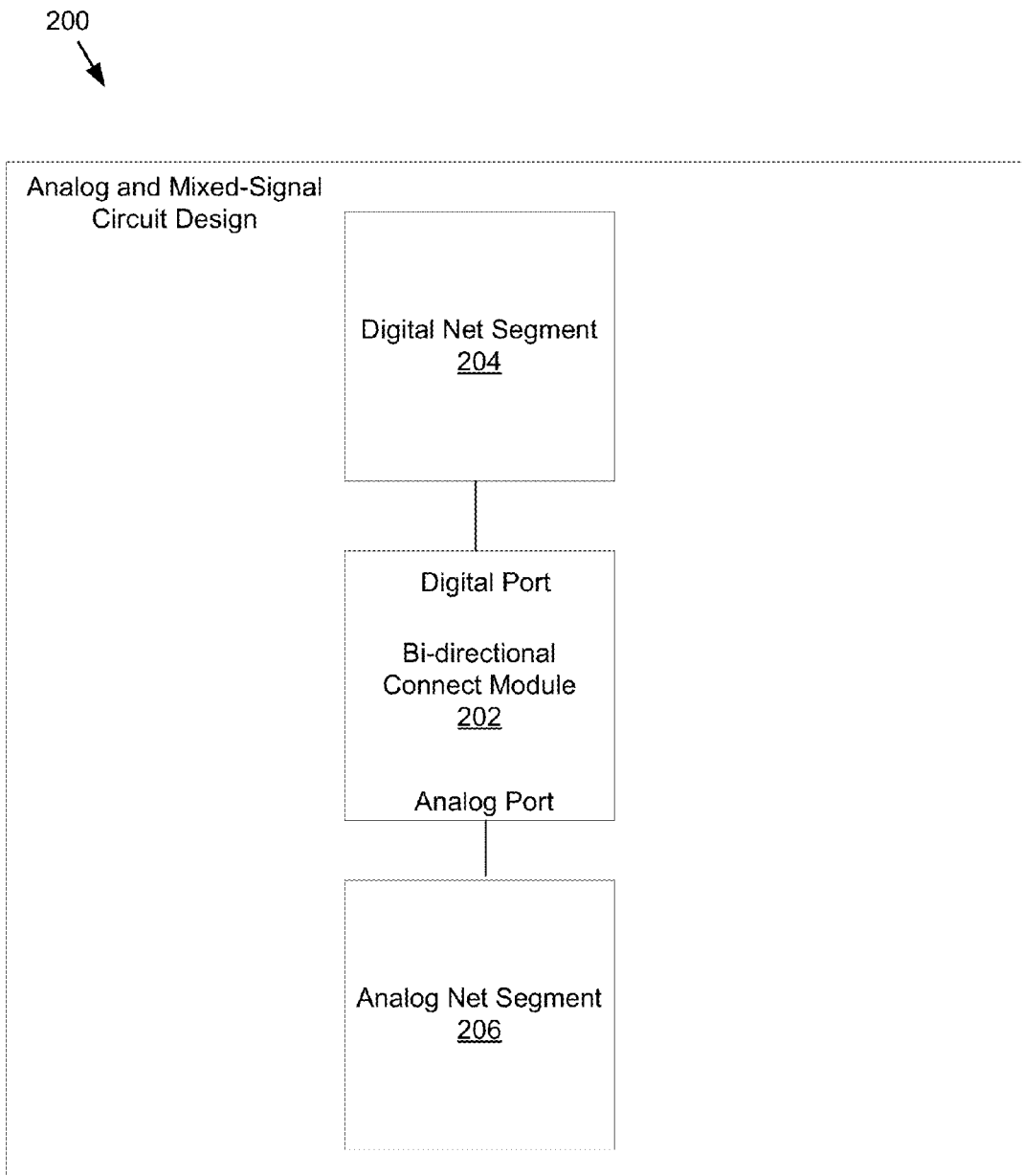
FIG. 2 is a diagram depicting a bi-directional connect module linking a digital net segment with an analog net segment in accordance with the present disclosure.

Referring now to FIG. 2, an embodiment of the present disclosure depicting a bi-directional connect module is provided. FIG. 2 illustrates a configuration, where analog and mixed-signal circuit design 200 may utilize a bi-directional connect module 202 to connect a digital net segment 204 with an analog net segment 206. As illustrated, the bi-directional connect module 202 may not only connect the digital net 204 and analog net 206, but also may provide segregation of the net segments for simulation purposes. The bi-directional connect module may be further configured to convert in both directions simultaneously at any specific time during simulation.

Figure 3A:
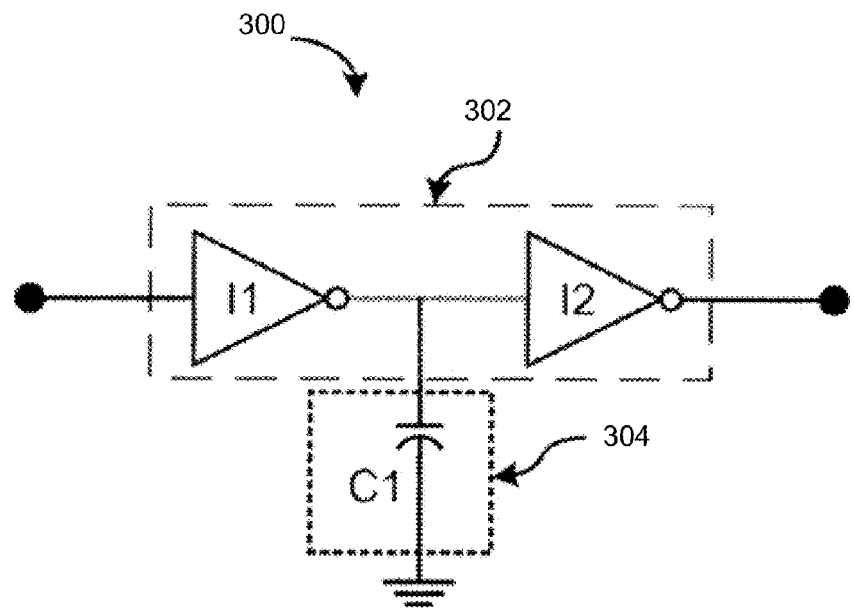
FIG. 3A-3B are diagrams depicting analog and mixed-signal circuit design both before and after driver-receiver segregation in accordance with the present disclosure.
Figure 3B:
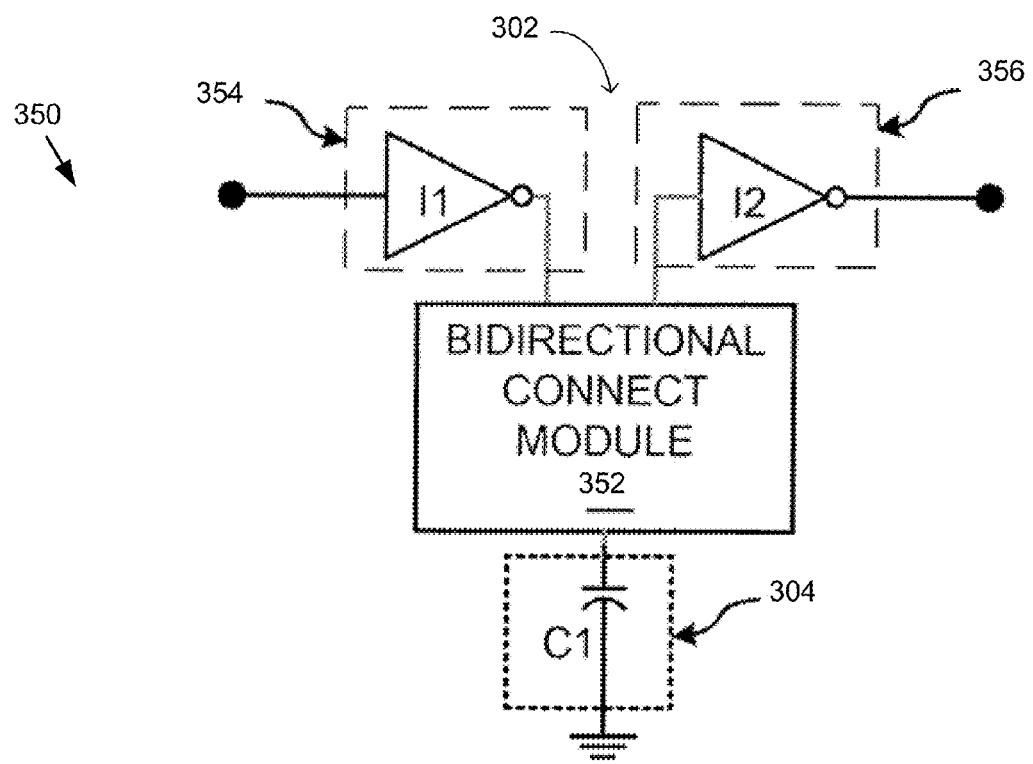

Conventionally, in order for a bi-directional connect module to properly account for the influences of an analog net on a digital net, a bi-directional connect module connecting the two nets may implement the concept of driver-receiver segregation (DRS) during mixed-signal simulation. Essentially, during simulation of the analog and mixed-signal circuit design using the driver-receiver segregation, ordinary drivers and ordinary receivers of a digital network (or digital net) connected to the digital port of a bi-directional connect module may be segregated into two net segments with no direct link between them. One segment may be (a) a driver net segment (e.g., driver digital network) connected to digital input port of the bi-directional connect module and comprising the ordinary drivers of the digital network; the other segment may be (b) a receiver net segment (e.g., receiver digital network) connected to the digital output port of the bidirectional connect module and comprising the ordinary receivers of the digital network. By doing so, the bi-directional connect module during mixed-signal simulation can control the link between the driver net segment and receiver net segment such that the contributions of the analog net can be properly and accurately accounted for in the behavior of the digital net. FIGS. 3A and 3B illustrate how driver-receiver segregation is typically utilized in simulation of an example analog and mixed-signal circuit.

Referring now to FIG. 3A, an example of an analog and mixed-signal circuit 300 comprising two inverters (I1 and I2) modeled in the digital (e,g. discrete) domain, and a capacitor modeled in the analog (e,g. continuous) domain is provided. The two inverters comprise digital net segment 302, while the capacitor comprises analog net segment 304. Typically, during simulation, a connect module would be inserted between segment 302 and segment 304, thereby partitioning the two circuit segments and allowing them to be simulated in their respective domains. However, without the use of driver-receiver segregation, as described above, the simulation of the circuit may produce an unexpected and incorrect result. In this specific instance, because the inverters are modeled in the digital domain, and know nothing about the presence of the analog domain due to the net segregation, the digital simulation kernel may propagate a signal from the first inverter I1 to the second inverter I2 without accounting for the signal delay induced by the presence of capacitor C1.

Referring now to FIG. 3B, an exemplary analog and mixed-signal circuit 350 is provided after insertion of a bi-directional connect module 352 between digital net segment 302 and analog net segment 304. Driver-receiver segregation (DRS) of the digital net segment 302 may result in a driver net 354 comprising only I1, and a receiver net 356 comprising only I2. As depicted, the driver net 354 is connected to the digital input port of module 352, while receiver net 356 is connected to the digital output port of module 352. By doing so, the connect module 352 is able to propagate the signal from the driver net 354 to the receiver net 356 with the delay attributed from analog net 304. It should be noted that conventionally, during analog and mixed-signal simulation (even under driver-receiver segregation) (a) the bi-directional connect module may perform digital and analog signal resolution (e.g., cross-domain signal conversion) between the analog circuit segment and the digital circuit segment; and (b) the transmission gate network may remain unaware of the existence of the one or more bi-directional connect modules connected to it.

For mixed-signal simulations, the alternative to using a bi-directional mixed-signal interface element (IE) (e.g., bi-directional connect module) would be to manually define the direction of the signal now for every connection. This is the case for SpectreVerilog, where once the direction of a signal has been properly defined, the simulation can insert digital-to-analog and analog-to-digital interface elements (IE's) accordingly.

Unfortunately, neither conventional bi-directional connect modules, nor manually defining the direction of signal flows, may be adequate for mixed-signal simulations when the design comprises bi-directional connection points. With respect to conventional bi-directional connect modules, which are based on driver-receiver segregation (DRS), the simulation cannot perform accurate chip-level verification when an analog net is connected to a digital net through a conventional bi-directional connect module because driver-receiver segregation may: (1) functionally verify a mixed-signal circuit design through simulation of the analog loading effect on digital receivers of the digital net, (2) but does so under the assumption that the circuit design does not contain bidirectional connection points (e.g., bi-directional connect modules).

Likewise, manually defining the direction of signal flows at bi-directional connection points may also fail to adequately simulate mixed-signal circuit designs having such connection points because it cannot fully verify the circuit design when the signal is dynamically bi-directional. Furthermore, in existing mixed-signal circuit design simulations, the interface element (IE) may fail to accurately reflect the signal strength from the analog driver, which may lead to additional erroneous simulation results, especially when the digital net is connected to multiple analog drivers.

Figure 4:
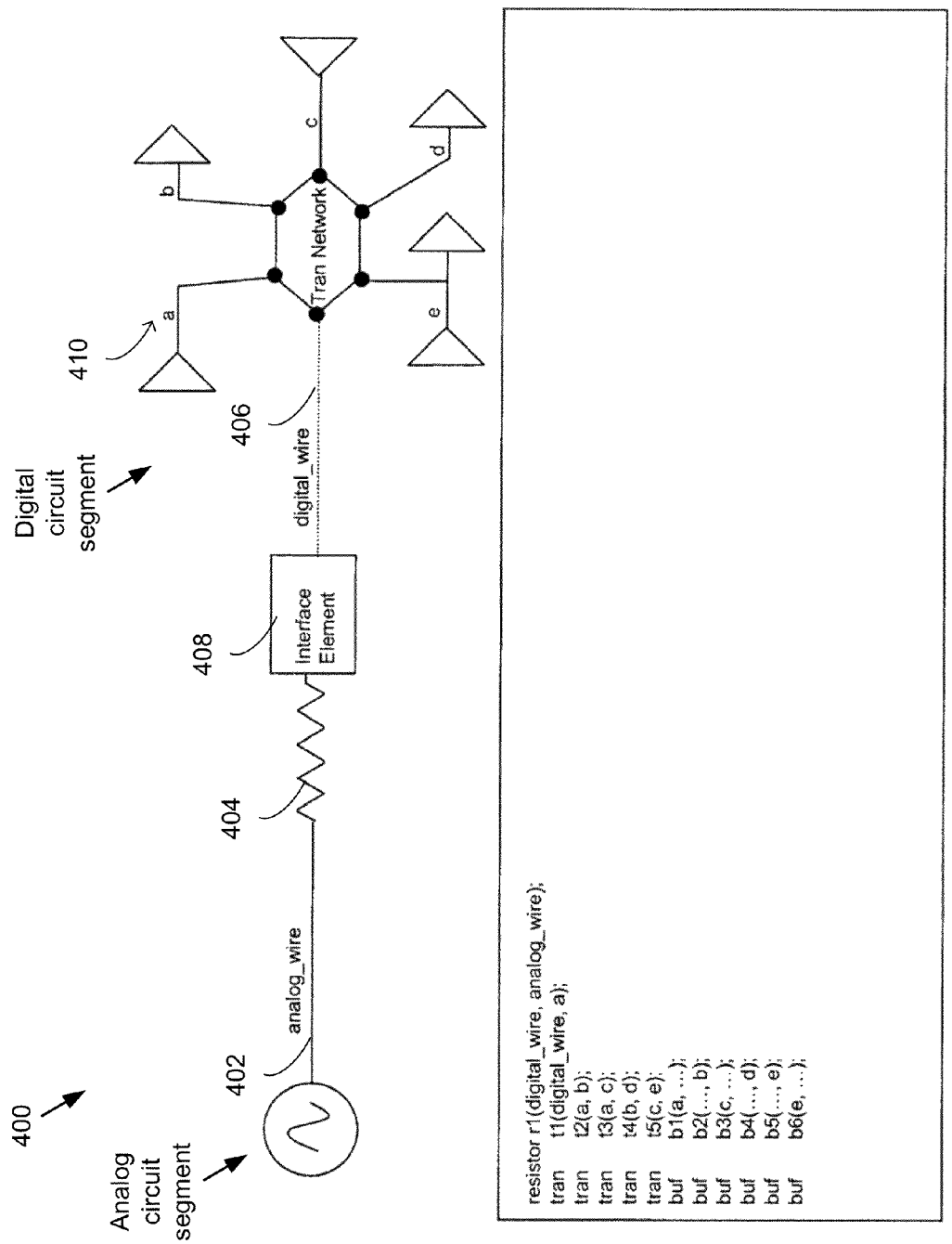
FIG. 4 is a diagram depicting an embodiment of a circuit diagram consistent with an embodiment of the present disclosure.

Referring now to FIG. 4, an exemplary circuit 400 is provided depicting both a schematic diagram and a Verilog HDL representation. Circuit 400 may include analog wire 402 on the left side of the diagram shown connected to the analog part of the circuit. Analog wire 401 may be connected via a resistor 404 to a digital wire 406. To interface between these analog and digital parts of the net, an interface element 408 may be provided. The digital wire 406 may then be connected to one terminal of a tran network 410.

Figure 5:
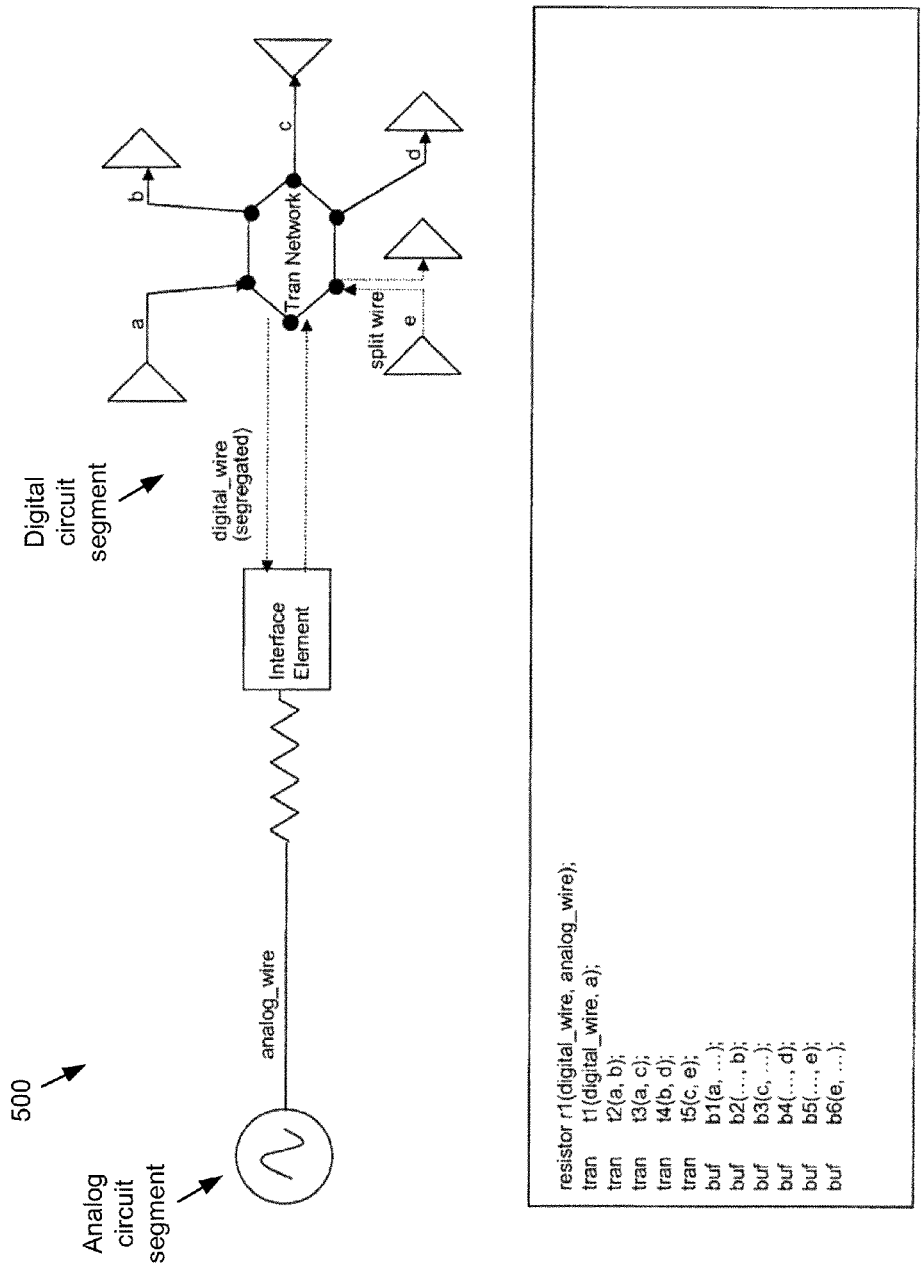
FIG. 5 is a diagram depicting an embodiment of a circuit diagram consistent with an embodiment of the present disclosure.

Referring now to FIG. 5, an exemplary circuit 500 is provided again depicting both a schematic diagram and a Verilog HDL representation. Circuit 500 illustrates the concepts of driver/receiver segregation. In this particular embodiment, the dotted lines may correspond to the split versions of nets which undergo segregation. In the first instance, we see the net "e" has been split as a result of connection to the tran network. In the second instance, we see the net "digital_net" has been split. This has actually been split for two reasons: it is connected to a tran network and also connected to an interface element. This second split net creates a potential problem in that a feedback loop has been created, which can result in the digital and analog nets latching up to a certain value possibly occurring after the drivers have been turned off.

Figure 6:
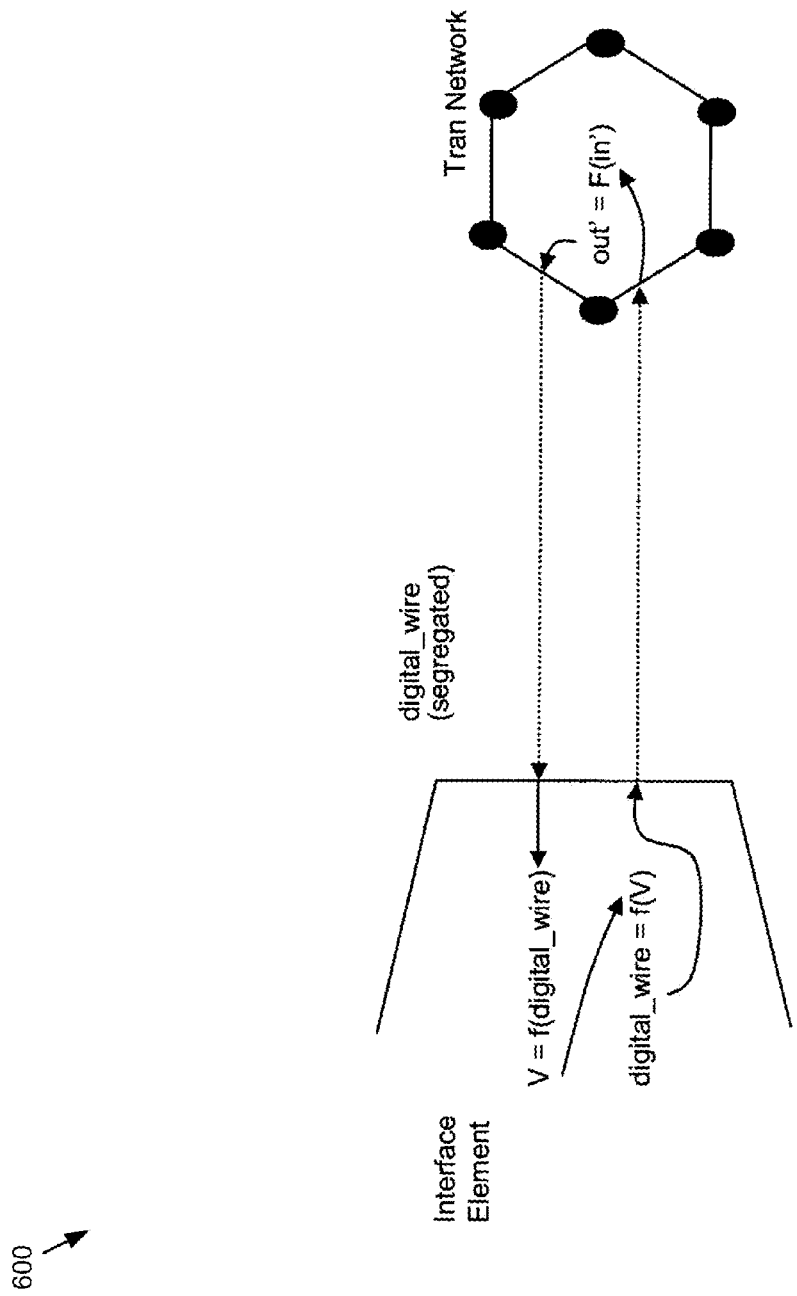
FIG. 6 is a diagram depicting an embodiment of a circuit diagram consistent with an embodiment of the present disclosure.

Referring now to FIG. 6, an exemplary diagram 600 is provided depicting the feedback loop issue identified above in greater detail. In this particular embodiment, the digital port of the interface element is shown in greater detail. With the interrelationships between the digital and analog segments of the net shown, one can clearly see the feedback loop that has been created. This feedback loop may be a direct result of the bidirectional nature of the interface element and the tran network in combination.

In some embodiments, the present disclosure may provide for bidirectional transfer of values between the analog and digital parts of the circuit including the tran network. This may result in reasonable accuracy, and does not produce latch up of the signal on the digital side of the interface element.

Figure 7:
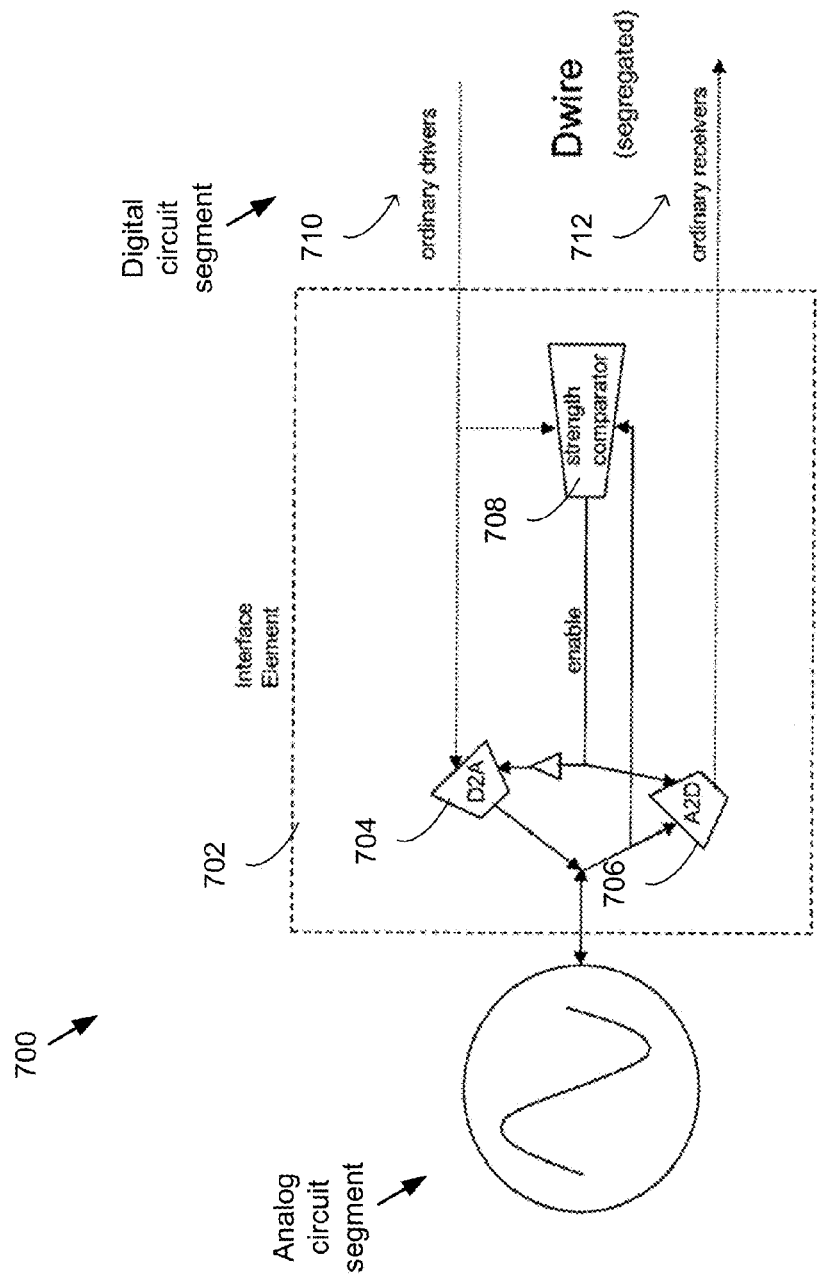
FIG. 7 is a diagram depicting an embodiment of a circuit diagram consistent with an embodiment of the present disclosure.

Referring now to FIG. 7, an exemplary diagram 700 is provided depicting switchable unidirectional interface element 702, which may be used to break the problems created by the feedback loop described herein. The bi-directional interface element may be converted into switchable unidirectional element 702, which may be configured to compare the relative driver strengths of the digital and analog parts of the circuit, and to drive either in to or out of analog based on these strengths. Switchable unidirectional element 702 may include one or more converters, including but not limited to, digital-to-analog converter 704 and analog-to-digital converter 706. Switchable unidirectional element 702 may further include one or more strength comparators 708. In this diagram, the strength comparison is being performed between the resolved value of only ordinary drivers 710 to the net and the drive strength of the analog part of the circuit. This analog driver strength may be based on output resistance of a voltage source. An more detailed discussion of the subject matter of FIG. 7 may be found in U.S. Pat. No. 7,870,518, assigned to the assignee of the subject application, the entire contents of which are incorporated by reference in their entirety.

In this way, the interface element may be configured to break the contention between the analog and digital drivers to the net. This may be accomplished by comparing the drive strengths of the digital and analog drivers and allowing the one with the greater strength to win. In some embodiments, additional measures may be taken in the case where the strengths are equal, for example, in driving an X. In this context "digital drivers" may refer to the digital only copy of the tran network which was created. In essence this changes the interface element from a purely bidirectional one to a switchable unidirectional element.

Figure 8:
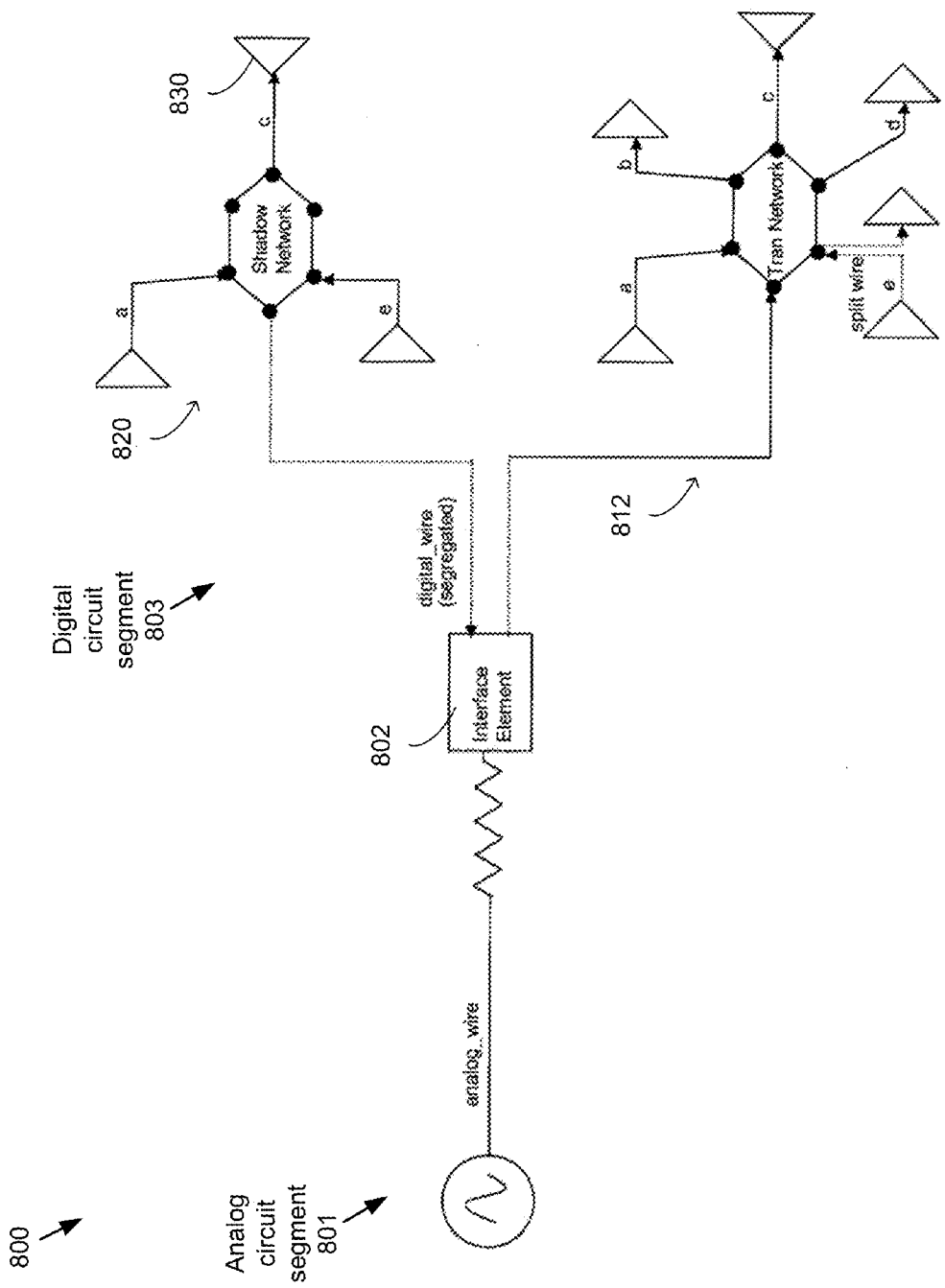
FIG. 8 is a diagram depicting an embodiment of a circuit diagram consistent with an embodiment of the present disclosure.

Referring now to FIG. 8, an exemplary diagram 800 is provided depicting a "shadow tran network" 820. Diagram 800 includes a bidirectional interface element 802 inserted at the connection point located between the digital circuit segment 803 and the analog circuit segment 801. Diagram 800 further depicts the digital circuit segment 803 once it has been split into a plurality of transistor network models 812 and 820 to provide for bi-directional transfer of data between the analog circuit segment 801 and the digital circuit segment 803.

In this particular embodiment a new tran network 820 is created which is only driven by the drivers (e.g. driver 830) outside of interface element 802. Thus, instead of merely splitting the net, both the net and its connected tran network 812 are split. For the purposes of the present disclosure, the newly created tran network is referred to as the shadow tran network 820. In some embodiments, the shadow tran network 820 may only be connected to the ordinary drivers.

In this way, the present disclosure may provide a method for expanding the driver/receiver segregation so that it encompasses the tran network itself. Thus, an entire new version of the tran network may be created, which may be connected only to the drivers from the digital circuit. In essence, a "digital-only" version of the tran network which the interface element can use as its digital input, just as the digital drivers are used in the case where no tran network is involved. The shadow tran network may be configured to provide access to a model of the connected tran network as if it were connected to only the digital drivers. In some embodiments, the tran network may be treated as a "net" in the context of driver/receiver segregation by splitting it into two networks. As discussed above, the interface element shown in FIG. 7 may break the contention between the analog and digital sides of the circuit based on the relative driving strengths of the two sides.

In some embodiments, the process of resolving the net and its connected tran network may include one or more of the following operations:

1) When the driven value or driven strength from either the shadow tran network 820 or the analog circuit changes, compare the digital drive strength with the analog driver strength;

2) If the digital drive strength is greater than the analog drive strength: drive the value from digital into the analog circuit, and drive a Hi-Z out from the interface element into the tran network 812 (D→A);

3) If the analog drive strength is greater than the digital drive strength: drive a Hi-Z into the analog circuit, and drive the converted value from analog into the tran network 812 (A→D);

4) The tran network resolution then occurs as normal and the newly resolved values are driven out to the readers of the tran network 812; and 5) If the drive strengths are equal the driven values are compared—if they are the same, this value is driven to both the analog circuit and the tran network 812. If they are not the same, then an X is driven to both sides.

In some embodiments, the bidirectional interface element described herein may be used in a variety of different applications in addition to the context of tran gate connections. Some of these may include, but are not limited to, standard delay format (SDF) interconnect delays (since this also modifies the drivers of the digital net, it collides with driver/receiver segregation), waveform display (since the interface element "sees" a different set of drivers then the connected digital net, probing or displaying the value of the two different objects can results in different values—this causes confusion among users who do not understand (or care about) the concept of driver/receiver segregation), and "Back-to-back" interface elements (e.g., if one interface element is connected directly to another, they do not "see" each other because they ignore connect drivers). In some embodiments, the use of bidirectional interface elements may permit the disabling of driver/receiver segregation, which may simplify numerous issues.

Figure 9:
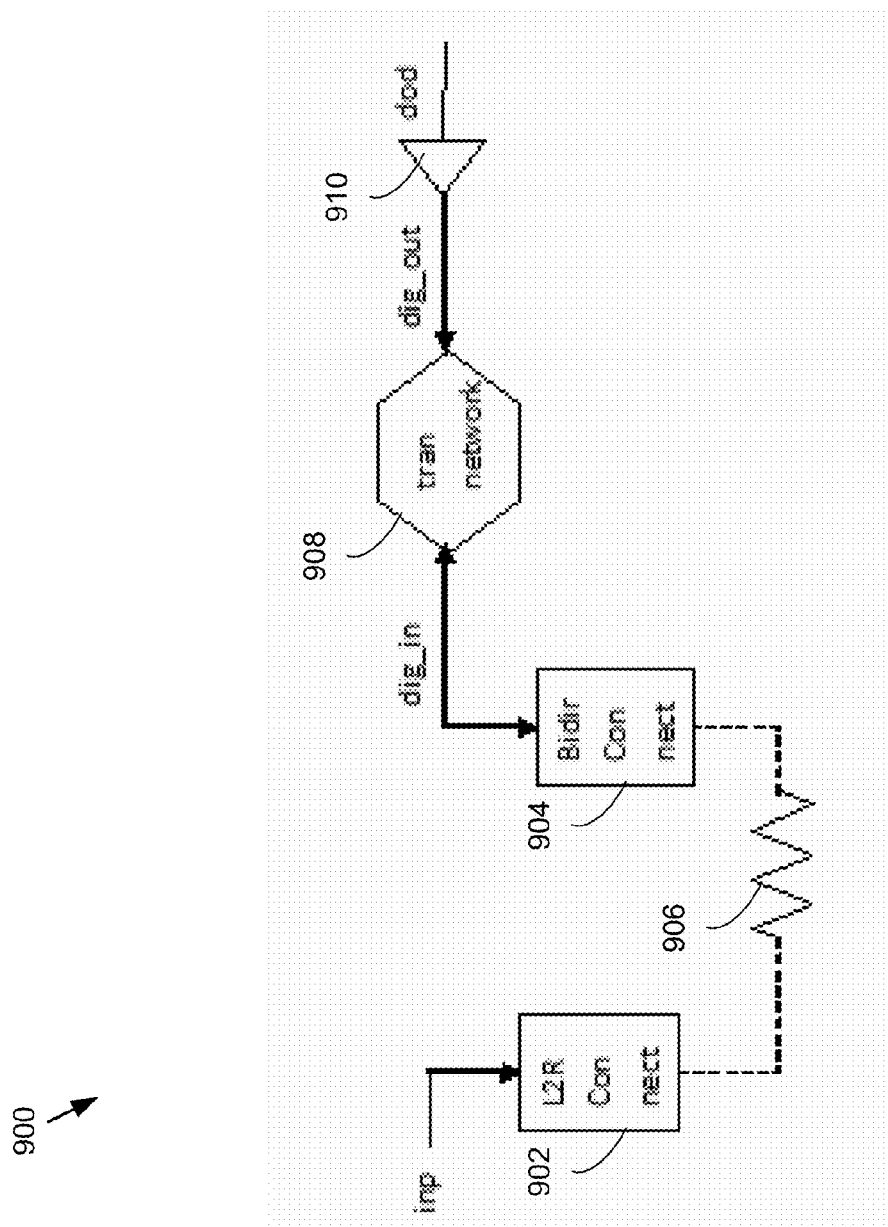
FIG. 9 is a diagram depicting an embodiment of a circuit diagram consistent with an embodiment of the present disclosure.

Referring now to FIG. 9, an exemplary diagram 900 is provided depicting an additional embodiment of the tran network. Diagram 900 includes L2R connect module 902 and bidirectional connect module 904 having resistor 906 included therebetween. In some embodiments, tran network 908 may be driven on one side by bidirectional connect module 904, and on the other side by a pure digital driver 910. The tran network may be stimulated by applying a stimulus from each side and seeing what the resolved values are. In some embodiments, digital driver 910 is assumed to have a higher drive strength than the driver from the bidirectional connect module 904. The sequence of stimuli applied may include one or more operations. For example, a low voltage may be driven from the analog side and a logic 0 from the digital side. In this case, both sides of the tran network may resolve to 0. A high voltage may be driven from the analog side, which should drive a logic 1 from the bidirectional connect module 904. The "dig_in" side of the tran network 908 should stay at 0, since the 0 is being driven from dig_out with a stronger drive strength. This should then cause the analog side of bidirectional connect module 904 to float somewhere between a high and low voltage. If a low voltage is driven from the analog side, both sides may resolve to 0. Next, drive a logic 1 from the digital side. Since this has a higher drive strength then the bidirectional connect module 904, it should cause both sides of the tran network 908 to resolve to 1. This should then cause the analog side of the bidirectional connect module 904 to float somewhere between a high and low voltage.

Figure 10:
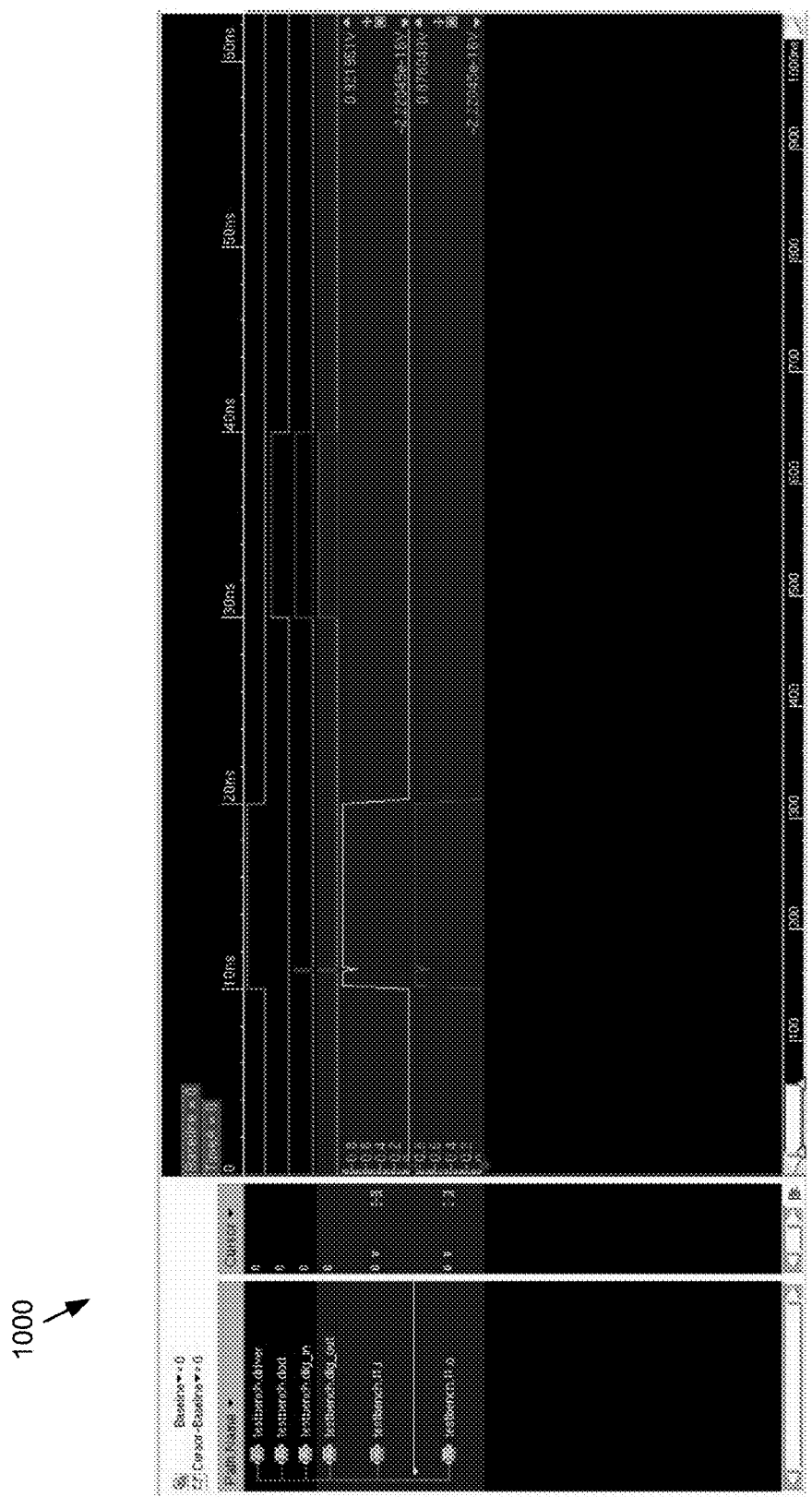
FIG. 10 is a diagram depicting a waveform generated without using the design simulation process of the present disclosure.

Referring now to FIG. 10, an exemplary waveform 1000 is provided depicting the resultant waveform if driver/receiver segregation has been turned off. In particular, look at the time 30 ns. This corresponds to driving a logic 1 from the digital side as discussed above. However, instead of both sides resolving to a logic 1, they go to X. The analog side of the bidirectional connect module also stays at a low voltage. This is because the digital side of the bidirectional connect module has latched up—it is still seeing the old value of logic 0 being driven from the tran network and it is driving it back out to take part in the resolution of the tran network.

Figure 11:
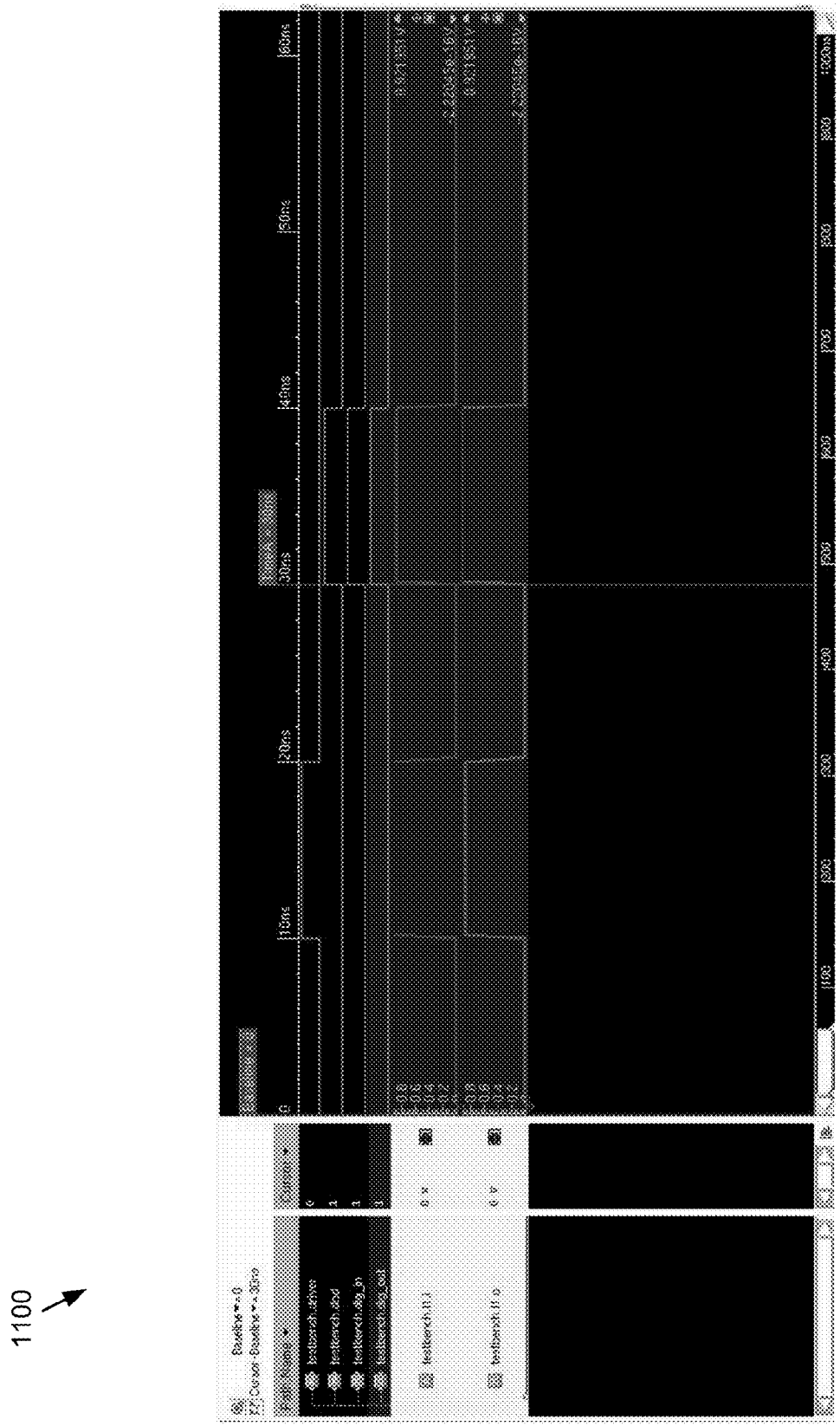
FIG. 11 is a diagram depicting a waveform generated in accordance with an embodiment of the present disclosure.

Referring now to FIG. 11, an exemplary waveform 1100 is provided depicting a resultant waveform in accordance with the teachings of the present disclosure. In this particular example, the logic 1 driven from the digital side of the tran network correctly overdrives the 0 from the analog side, both sides of the tran network resolve to 1, and the analog side of the bidirectional connect module goes to a high voltage.

Figure 12:
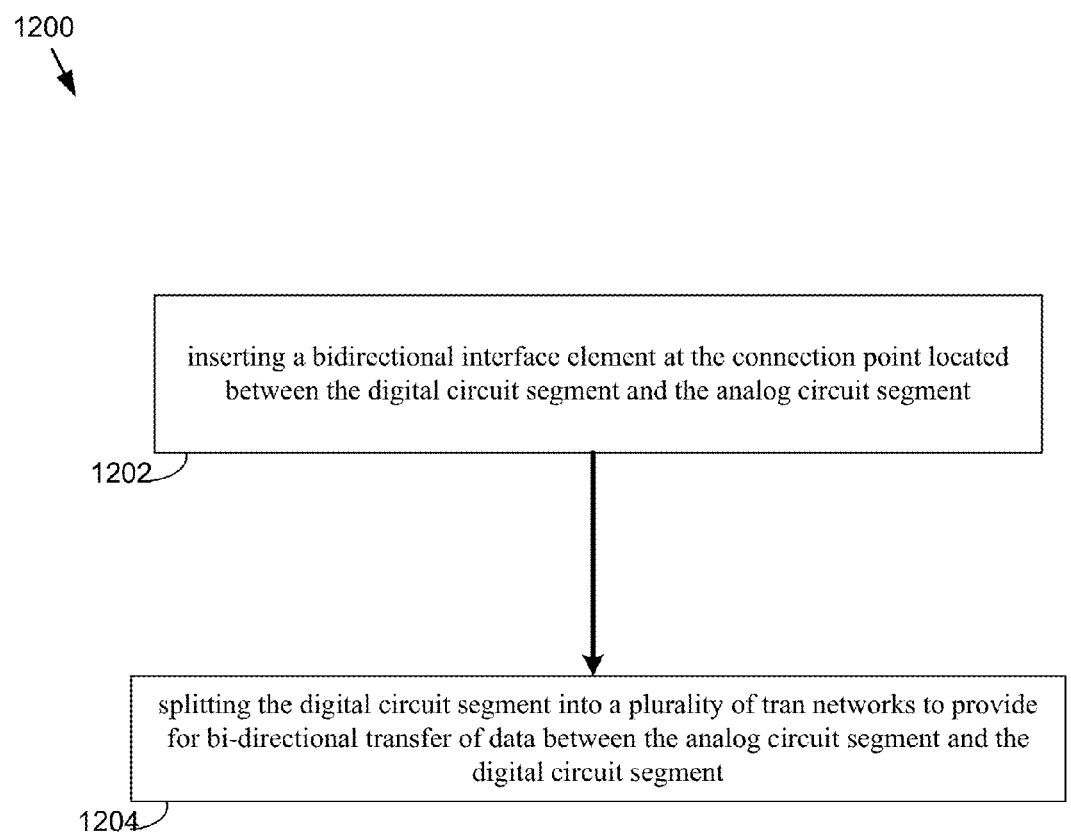
FIG. 12 is a flowchart depicting operations incorporating the design simulation process in accordance with an embodiment of the present disclosure.

Referring now to FIG. 12, an exemplary flowchart 1200 depicting operations consistent with the present disclosure is provided. Operations may include inserting a bidirectional interface element at the connection point located between the digital circuit segment and the analog circuit segment (1202). Operations may further include splitting the digital circuit segment into a plurality of tran networks to provide for bi-directional transfer of data between the analog circuit segment and the digital circuit segment (1204). Numerous additional operations are also within the scope of the present disclosure. For example, operations may additionally include detecting a change in drive strength of at least one of the shadow transistor network model and the analog circuit segment and comparing a digital drive strength from the shadow transistor network model with an analog drive strength from the analog circuit segment.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for simulating an analog and mixed-signal circuit design having a digital circuit segment connected to an analog circuit segment at a connection point comprising:

inserting, using a processor, a switchable unidirectional interface element at the connection point located between the digital circuit segment and the analog circuit segment; and splitting the digital circuit segment into a plurality of transistor network models to provide for switchable unidirectional transfer of data between the analog circuit segment and the digital circuit segment wherein the plurality of transistor network models includes a transistor network model and a shadow transistor network model, wherein the shadow transistor network model is a digital version of the transistor network model, the transistor network model and the shadow transistor network model being associated with the digital circuit segment and are each individually connected to the switchable unidirectional interface element, and wherein the shadow transistor network model is connected to one or more digital drivers separate from the switchable unidirectional interface element, wherein the switchable unidirectional interface element is configured to compare driver strengths between a digital and analog part of a circuit.

2. The computer-implemented method of claim 1, further comprising:

detecting a change in drive strength of at least one of the shadow transistor network model and the analog circuit segment.

3. The computer-implemented method of claim 2, further comprising:

comparing a digital drive strength from the shadow transistor network model with an analog drive strength from the analog circuit segment.

4. The computer-implemented method of claim 3, further comprising:

if the digital drive strength is greater than the analog drive strength, driving a value from the digital circuit segment into the analog circuit segment and driving a high-impedance value (Hi-Z) out from the switchable unidirectional interface element into the transistor network model.

5. The computer-implemented method of claim 3, further comprising:
if the analog drive strength is greater than the digital drive strength, driving a high-impedance value (Hi-Z) into the analog circuit segment and driving a converted value from the analog circuit segment into the transistor network model.

6. The computer-implemented method of claim 3, further comprising:
if the analog drive strength is the same as the digital drive strength, comparing a first driven value from the analog circuit segment with a second driven value from the transistor network model.

7. A system for simulating an analog and mixed-signal circuit design having a digital circuit segment connected to an analog circuit segment at a connection point comprising:
a computing device having at least one processor configured to insert a switchable unidirectional interface element at the connection point located between the digital circuit segment and the analog circuit segment; and
split the digital circuit segment into a plurality of transistor network models to provide for switchable unidirectional transfer of data between the analog circuit segment and the digital circuit segment wherein the plurality of transistor network models includes a transistor network model and a shadow transistor network model, wherein the shadow transistor network model is a digital version of the transistor network model, the transistor network model and the shadow transistor network model being associated with the digital circuit segment and are each individually connected to the switchable unidirectional interface element, and wherein the shadow transistor network model is connected to one or more digital drivers separate from the switchable unidirectional interface element wherein the switchable unidirectional interface element is configured to compare driver strengths between a digital and analog part of a circuit.

8. The system of claim 7, wherein the processor is further configured to detect a change in drive strength of at least one of the shadow transistor network model and the analog circuit segment.

9. The system of claim 8, wherein the processor is further configured to compare a digital drive strength from the shadow transistor network model with an analog drive strength from the analog circuit segment.

10. The system of claim 9, wherein if the digital drive strength is greater than the analog drive strength, the processor is further configured to drive a value from the digital circuit segment into the analog circuit segment and driving a high-impedance value (Hi-Z) out from the switchable unidirectional interface element into the transistor network model.

11. The system of claim 9, wherein if the analog drive strength is greater than the digital drive strength, the processor is further configured to drive a high-impedance value (Hi-Z) into the analog circuit segment and driving a converted value from the analog circuit segment into the transistor network model.

12. The system of claim 9, wherein if the analog drive strength is the same as the digital drive strength, the processor is further configured to compare a first driven value from the analog circuit segment with a second driven value from the transistor network model.

13. A non-transitory computer-readable storage medium for simulating an analog and mixed-signal circuit design having a digital circuit segment connected to an analog circuit segment at a connection point, the computer-readable storage medium having stored thereon instructions that when executed by a machine result in one or more operations, the operations comprising:
inserting a switchable unidirectional interface element at the connection point located between the digital circuit segment and the analog circuit segment; and
splitting the digital circuit segment into a plurality of transistor network models to provide for switchable unidirectional transfer of data between the analog circuit segment and the digital circuit segment wherein the plurality of transistor network models includes a transistor network model and a shadow transistor network model, wherein the shadow transistor network model is a digital version of the transistor network model, the transistor network model and the shadow transistor network model being associated with the digital circuit segment and are each individually connected to the switchable unidirectional interface element, and wherein the shadow transistor network model is connected to one or more digital drivers separate from the switchable unidirectional interface element wherein the switchable unidirectional interface element is configured to compare driver strengths between a digital and analog part of a circuit.

14. The computer-readable storage medium of claim 13, wherein operations further comprise:
detecting a change in drive strength of at least one of the shadow transistor network model and the analog circuit segment.

15. The computer-readable storage medium of claim 14, wherein operations further comprise:
comparing a digital drive strength from the shadow transistor network model with an analog drive strength from the analog circuit segment.

16. The computer-readable storage medium of claim 15, wherein operations further comprise:
if the digital drive strength is greater than the analog drive strength, driving a value from the digital circuit segment into the analog circuit segment and driving a high-impedance value (Hi-Z) out from the switchable unidirectional interface element into the transistor network model.

17. The computer-readable storage medium of claim 15, wherein operations further comprise:
if the analog drive strength is greater than the digital drive strength, driving a high-impedance value (Hi-Z) into the analog circuit segment and driving a converted value from the analog circuit segment into the transistor network model.

* * * * *